US010998859B2

(12) United States Patent
Khlat

(10) Patent No.: US 10,998,859 B2
(45) Date of Patent: May 4, 2021

(54) DUAL-INPUT ENVELOPE TRACKING INTEGRATED CIRCUIT AND RELATED APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/435,940

(22) Filed: Jun. 10, 2019

(65) Prior Publication Data
US 2020/0259456 A1    Aug. 13, 2020

Related U.S. Application Data

(60) Provisional application No. 62/802,282, filed on Feb. 7, 2019.

(51) Int. Cl.
*H03F 1/02*  (2006.01)
*H03F 3/213*  (2006.01)
*H03F 3/195*  (2006.01)

(52) U.S. Cl.
CPC ........... *H03F 1/0222* (2013.01); *H03F 3/195* (2013.01); *H03F 3/213* (2013.01); *H03F 2200/102* (2013.01); *H03F 2200/451* (2013.01)

(58) Field of Classification Search
CPC ........ H03F 1/0222; H03F 3/213; H03F 3/195; H03F 2200/451; H03F 2200/102; H03F 3/245
USPC ................ 330/136, 279, 297, 127, 129, 134
See application file for complete search history.

(56) References Cited

U.S. PATENT DOCUMENTS

| 5,838,732 | A  | 11/1998 | Carney |
| 6,107,862 | A  | 8/2000  | Mukainakano et al. |
| 6,141,377 | A  | 10/2000 | Sharper et al. |
| 6,985,033 | B1 | 1/2006  | Shirali et al. |

(Continued)

FOREIGN PATENT DOCUMENTS

EP    3174199 A2    5/2017

OTHER PUBLICATIONS

Non-Final Office Action for U.S. Appl. No. 14/836,634, dated May 16, 2016, 9 pages.

(Continued)

*Primary Examiner* — Hieu P Nguyen
(74) *Attorney, Agent, or Firm* — Withrow & Terranova, P.L.L.C.

(57) ABSTRACT

A dual-input envelope tracking (ET) integrated circuit (ETIC) and related apparatus are provided. The dual-input ETIC includes an ET voltage circuit configured to generate an ET voltage based on an ET voltage and a first set of parameters. The ET voltage may be provided to a power amplifier circuit(s) for amplifying a radio frequency (RF) signal(s) in an ET power range. The dual-input ETIC also includes a target voltage processing circuit configured to generate the ET target voltage based on a second set of parameters. The dual-input ETIC further includes a control circuit configured to determine the first set of parameters and the second set parameters based at least on the ET power range of the power amplifier circuit(s). As such, it may be possible to optimize the dual-input ETIC performance in a wide-range of modulation bandwidth, thus helping to improve linearity and efficiency of the power amplifier circuit(s).

20 Claims, 5 Drawing Sheets

(56) References Cited

U.S. PATENT DOCUMENTS

| | | |
|---|---|---|
| 7,043,213 B2 | 5/2006 | Robinson et al. |
| 7,471,155 B1 | 12/2008 | Levesque |
| 7,570,931 B2 | 8/2009 | McCallister et al. |
| 8,461,928 B2 | 6/2013 | Yahav et al. |
| 8,493,141 B2 | 7/2013 | Khlat et al. |
| 8,588,713 B2 | 11/2013 | Khlat |
| 8,718,188 B2 | 5/2014 | Balteanu et al. |
| 8,725,218 B2 | 5/2014 | Brown et al. |
| 8,774,065 B2 | 7/2014 | Khlat et al. |
| 8,803,603 B2 | 8/2014 | Wimpenny |
| 8,818,305 B1 | 8/2014 | Schwent et al. |
| 8,854,129 B2 | 10/2014 | Wilson |
| 8,879,665 B2 | 11/2014 | Xia et al. |
| 8,913,690 B2 | 12/2014 | Onishi |
| 8,989,682 B2 | 3/2015 | Ripley et al. |
| 9,020,451 B2 | 4/2015 | Khlat |
| 9,041,364 B2 | 5/2015 | Khlat |
| 9,041,365 B2 | 5/2015 | Kay et al. |
| 9,055,529 B2 | 6/2015 | Shih |
| 9,065,509 B1 | 6/2015 | Yan et al. |
| 9,069,365 B2 | 6/2015 | Brown et al. |
| 9,098,099 B2 | 8/2015 | Park et al. |
| 9,166,830 B2 | 10/2015 | Camuffo et al. |
| 9,167,514 B2 * | 10/2015 | Dakshinamurthy ............... H04W 52/0209 |
| 9,197,182 B2 | 11/2015 | Baxter et al. |
| 9,225,362 B2 | 12/2015 | Drogi et al. |
| 9,247,496 B2 | 1/2016 | Khlat |
| 9,263,997 B2 | 2/2016 | Vinayak |
| 9,270,230 B2 | 2/2016 | Henshaw et al. |
| 9,270,239 B2 | 2/2016 | Drogi et al. |
| 9,271,236 B2 * | 2/2016 | Drogi ............... H03F 3/24 |
| 9,280,163 B2 | 3/2016 | Kay et al. |
| 9,288,098 B2 | 3/2016 | Yan et al. |
| 9,298,198 B2 | 3/2016 | Kay et al. |
| 9,344,304 B1 | 5/2016 | Cohen |
| 9,356,512 B2 | 5/2016 | Chowdhury et al. |
| 9,377,797 B2 | 6/2016 | Kay et al. |
| 9,379,667 B2 | 6/2016 | Khlat et al. |
| 9,515,622 B2 | 12/2016 | Nentwig et al. |
| 9,520,907 B2 | 12/2016 | Peng et al. |
| 9,584,071 B2 | 2/2017 | Khlat |
| 9,595,869 B2 | 3/2017 | Lerdworatawee |
| 9,595,981 B2 | 3/2017 | Khlat |
| 9,596,110 B2 | 3/2017 | Jiang et al. |
| 9,614,477 B1 | 4/2017 | Rozenblit et al. |
| 9,634,666 B2 | 4/2017 | Krug |
| 9,748,845 B1 | 8/2017 | Kotikalapoodi |
| 9,806,676 B2 | 10/2017 | Balteanu et al. |
| 9,831,834 B2 | 11/2017 | Balteanu et al. |
| 9,837,962 B2 | 12/2017 | Mathe et al. |
| 9,923,520 B1 | 3/2018 | Abdelfattah et al. |
| 10,003,416 B1 | 6/2018 | Lloyd |
| 10,090,808 B1 | 10/2018 | Henzler et al. |
| 10,097,145 B1 | 10/2018 | Khlat et al. |
| 10,110,169 B2 | 10/2018 | Khesbak et al. |
| 10,158,329 B1 | 12/2018 | Khlat |
| 10,158,330 B1 | 12/2018 | Khlat |
| 10,170,989 B2 | 1/2019 | Balteanu et al. |
| 10,291,181 B2 | 5/2019 | Kim et al. |
| 10,326,408 B2 | 6/2019 | Khlat et al. |
| 10,382,071 B2 | 8/2019 | Rozek et al. |
| 10,476,437 B2 | 11/2019 | Nag et al. |
| 2002/0167827 A1 | 11/2002 | Umeda et al. |
| 2004/0266366 A1 | 12/2004 | Robinson et al. |
| 2005/0090209 A1 | 4/2005 | Behzad |
| 2005/0227646 A1 | 10/2005 | Yamazaki et al. |
| 2005/0232385 A1 | 10/2005 | Yoshikawa et al. |
| 2006/0240786 A1 | 10/2006 | Liu |
| 2007/0052474 A1 | 3/2007 | Saito |
| 2007/0258602 A1 | 11/2007 | Vepsalainen et al. |
| 2009/0016085 A1 | 1/2009 | Rader et al. |
| 2009/0045872 A1 | 2/2009 | Kenington |
| 2009/0191826 A1 | 7/2009 | Takinami et al. |
| 2010/0308919 A1 | 12/2010 | Adamski et al. |
| 2011/0074373 A1 | 3/2011 | Lin |
| 2011/0136452 A1 | 6/2011 | Pratt et al. |
| 2011/0175681 A1 | 7/2011 | Inamori et al. |
| 2011/0279179 A1 | 11/2011 | Vice |
| 2012/0194274 A1 | 8/2012 | Fowers et al. |
| 2012/0200435 A1 | 8/2012 | Ngo et al. |
| 2012/0299645 A1 | 11/2012 | Southcombe et al. |
| 2012/0299647 A1 | 11/2012 | Honjo et al. |
| 2013/0021827 A1 | 1/2013 | Ye |
| 2013/0100991 A1 | 4/2013 | Woo |
| 2013/0130724 A1 | 5/2013 | Kumar Reddy et al. |
| 2013/0162233 A1 | 6/2013 | Marty |
| 2013/0187711 A1 | 7/2013 | Goedken et al. |
| 2013/0200865 A1 | 8/2013 | Wimpenny |
| 2013/0271221 A1 | 10/2013 | Levesque et al. |
| 2014/0009226 A1 | 1/2014 | Severson |
| 2014/0028370 A1 | 1/2014 | Wimpenny |
| 2014/0028390 A1 | 1/2014 | Davis |
| 2014/0057684 A1 | 2/2014 | Khlat |
| 2014/0103995 A1 | 4/2014 | Langer |
| 2014/0155002 A1 | 6/2014 | Dakshinamurthy et al. |
| 2014/0184335 A1 | 7/2014 | Nobbe et al. |
| 2014/0199949 A1 | 7/2014 | Nagode et al. |
| 2014/0210550 A1 | 7/2014 | Mathe et al. |
| 2014/0218109 A1 | 8/2014 | Wimpenny |
| 2014/0235185 A1 | 8/2014 | Drogi |
| 2014/0266423 A1 | 9/2014 | Drogi et al. |
| 2014/0266428 A1 | 9/2014 | Chiron et al. |
| 2014/0315504 A1 | 10/2014 | Sakai et al. |
| 2014/0361830 A1 | 12/2014 | Mathe et al. |
| 2015/0048883 A1 | 2/2015 | Vinayak |
| 2015/0071382 A1 | 3/2015 | Wu et al. |
| 2015/0098523 A1 | 4/2015 | Lim et al. |
| 2015/0155836 A1 | 6/2015 | Midya et al. |
| 2015/0188432 A1 | 7/2015 | Vannorsdel et al. |
| 2015/0236654 A1 | 8/2015 | Jiang et al. |
| 2015/0236729 A1 | 8/2015 | Peng et al. |
| 2015/0280652 A1 | 10/2015 | Cohen |
| 2015/0333781 A1 | 11/2015 | Alon et al. |
| 2016/0065137 A1 | 3/2016 | Khlat |
| 2016/0099687 A1 | 4/2016 | Khlat |
| 2016/0105151 A1 | 4/2016 | Langer |
| 2016/0118941 A1 | 4/2016 | Wang |
| 2016/0126900 A1 | 5/2016 | Shute |
| 2016/0173031 A1 | 6/2016 | Langer |
| 2016/0181995 A1 | 6/2016 | Nentwig et al. |
| 2016/0187627 A1 | 6/2016 | Abe |
| 2016/0197627 A1 | 7/2016 | Qin et al. |
| 2016/0226448 A1 | 8/2016 | Wimpenny |
| 2016/0294587 A1 | 10/2016 | Jiang et al. |
| 2017/0141736 A1 | 5/2017 | Pratt et al. |
| 2017/0302183 A1 | 10/2017 | Young |
| 2017/0317913 A1 | 11/2017 | Kim et al. |
| 2017/0338773 A1 | 11/2017 | Balteanu et al. |
| 2018/0013465 A1 | 1/2018 | Chiron et al. |
| 2018/0048265 A1 | 2/2018 | Nentwig |
| 2018/0048276 A1 | 2/2018 | Khlat et al. |
| 2018/0076772 A1 | 3/2018 | Khesbak et al. |
| 2018/0123453 A1 | 5/2018 | Puggelli et al. |
| 2018/0288697 A1 | 10/2018 | Camuffo et al. |
| 2018/0302042 A1 | 10/2018 | Zhang et al. |
| 2018/0309414 A1 | 10/2018 | Khlat et al. |
| 2018/0367101 A1 | 12/2018 | Chen et al. |
| 2019/0044480 A1 | 2/2019 | Khlat |
| 2019/0068234 A1 | 2/2019 | Khlat et al. |
| 2019/0097277 A1 | 3/2019 | Fukae |
| 2019/0109566 A1 | 4/2019 | Folkmann et al. |
| 2019/0109613 A1 | 4/2019 | Khlat et al. |
| 2019/0222178 A1 | 7/2019 | Khlat et al. |
| 2019/0267956 A1 | 8/2019 | Granger-Jones et al. |
| 2019/0222175 A1 | 10/2019 | Khlat et al. |
| 2020/0007090 A1 | 1/2020 | Khlat et al. |
| 2020/0036337 A1 | 1/2020 | Khlat |
| 2020/0136561 A1 | 4/2020 | Khlat et al. |
| 2020/0136575 A1 | 4/2020 | Khlat et al. |
| 2020/0153394 A1 | 5/2020 | Khlat et al. |
| 2020/0177131 A1 | 6/2020 | Khlat |
| 2020/0204116 A1 | 6/2020 | Khlat |

(56) References Cited

U.S. PATENT DOCUMENTS

2020/0228063 A1 7/2020 Khlat
2020/0259685 A1 8/2020 Khlat
2020/0266766 A1 8/2020 Khlat et al.

OTHER PUBLICATIONS

Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.
Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.
Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Notice of Allowance for U.S. Appl. No. 15/792,909, dated Dec. 19, 2018, 11 pages.
Notice of Allowance for U.S. Appl. No. 15/993,705, dated Oct. 31, 2018, 7 pages.
Pfister, Henry, "Discrete-Time Signal Processing," Lecture Note, pfister.ee.duke.edu/courses/ece485/dtsp.pdf, Mar. 3, 2017, 22 pages.
Non-Final Office Action for U.S. Appl. No. 15/888,260, dated May 2, 2019, 14 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Advisory Action for U.S. Appl. No. 15/888,300, dated Jun. 5, 2019, 3 pages.
Notice of Allowance for U.S. Appl. No. 15/984,566, dated May 21, 2019, 6 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Final Office Action for U.S. Appl. No. 15/986,948, dated Aug. 27, 2019, 9 pages.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Final Office Action for U.S. Appl. No. 16/018,426, dated Sep. 4, 2019, 12 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 16/155,127, dated Jun. 1, 2020, 8 pages.
Corrected Notice of Allowability for U.S. Appl. No. 15/888,300, dated May 13, 2020, 7 pages.
Non-Final Office Action for U.S. Appl. No. 16/246,859, dated Apr. 28, 2020, 9 pages.
Notice of Allowance for U.S. Appl. No. 16/354,234, dated Apr. 24, 2020, 9 pages.
Non-Final Office Action for U.S. Appl. No. 16/122,611, dated Mar. 11, 2020, 16 pages.
Notice of Allowance for U.S. Appl. No. 15/888,300, dated Jan. 14, 2020, 11 pages.
Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, mailed Mar. 6, 2020, 8 pages.
Final Office Action for U.S. Appl. No. 16/122,611, dated Sep. 18, 2020, 17 pages.
Final Office Action for U.S. Appl. No. 16/174,535, dated Jul. 1, 2020, 7 pages.
Notice of Allowance for U.S. Appl. No. 16/246,859, dated Sep. 18, 2020, 8 pages.
Non-Final Office Action for U.S. Appl. No. 16/284,023, dated Jun. 24, 2020, 7 pages.
Quayle Action for U.S. Appl. No. 16/421,905, mailed Aug. 25, 2020, 5 pages.
Non-Final Office Action for U.S. Appl. No. 16/774,060, dated Aug. 17, 2020, 6 pages.
Notice of Allowance for U.S. Appl. No. 16/122,611, dated Dec. 1, 2020, 9 pages.
Advisory Action for U.S. Appl. No. 16/174,535, dated Sep. 24, 2020, 3 pages.
Notice of Allowance for U.S. Appl. No. 16/174,535, dated Oct. 29, 2020, 7 pages.
Final Office Action for U.S. Appl. No. 16/284,023, dated Nov. 3, 2020, 7 pages.
Non-Final Office Action for U.S. Appl. No. 16/416,812, dated Oct. 16, 2020, 8 pages.
Non-Final Office Action for U.S. Appl. No. 16/514,051, dated Nov. 13, 2020, 9 pages.
Quayle Action for U.S. Appl. No. 16/589,940, mailed Dec. 4, 2020, 8 pages.
Notice of Allowance for U.S. Appl. No. 16/122,611, dated Jan. 13, 2021, 8 pages.
Notice of Allowance for U.S. Appl. No. 16/284,023, dated Jan. 19, 2021, 7 pages.
Notice of Allowance for U.S. Appl. No. 16/416,812, dated Feb. 16, 2021, 8 pages.
Non-Final Office Action for U.S. Appl. No. 16/689,236 dated Mar. 2, 2021, 15 pages.
Notice of Allowance for U.S. Appl. No. 16/774,060, dated Feb. 3, 2021, 7 pages.
Notice of Allowance for U.S. Appl. No. 16/590,790, dated Jan. 27, 2021, 7 pages.
Notice of Allowance for U.S. Appl. No. 16/661,061, dated Feb. 10, 2021, 7 pages.

* cited by examiner

DUAL-INPUT ENVELOPE TRACKING INTEGRATED CIRCUIT AND RELATED APPARATUS

RELATED APPLICATIONS

This application claims the benefit of U.S. provisional patent application Ser. No. 62/802,282, filed on Feb. 7, 2019, the disclosure of which is incorporated herein by reference in its entirety.

FIELD OF THE DISCLOSURE

The technology of the disclosure relates generally to an envelope tracking (ET) amplifier apparatus in a wireless communication device.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as long-term evolution (LTE) and fifth-generation new-radio (5G-NR). To achieve the higher data rates in mobile communication devices, sophisticated power amplifiers may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

Envelope tracking (ET) is a power management technology designed to improve efficiency levels of power amplifiers to help reduce power consumption and thermal dissipation in a mobile communication device. In an ET system, an ET power amplifier(s) amplifies an RF signal(s) based on time-variant voltages generated in accordance to time-variant amplitudes of the RF signal(s). The time-variant voltages increase as the time-variant amplitudes rise and decrease as the time-variant amplitudes fall. As such, the time-variant voltages correspond to a time-variant voltage envelope that tracks a time-variant power envelope associated with the time-variant signal amplitudes of the RF signal(s). Understandably, the better the time-variant voltage envelope tracks the time-variant power envelope, the higher efficiency can be achieved in the ET power amplifier(s). As such, it may be desired to ensure that the time-variant voltage envelope is consistently aligned with the time-variant power envelope at the ET power amplifier(s).

SUMMARY

Aspects disclosed in the detailed description include a dual-input envelope tracking (ET) integrated circuit (ETIC) and related apparatus. In examples discussed herein, the dual-input ETIC includes an ET voltage circuit configured to generate an ET voltage based on an ET voltage and a first set of parameters. The ET voltage may be provided to a power amplifier circuit(s) for amplifying a radio frequency (RF) signal(s) in an ET power range. The dual-input ETIC also includes a target voltage processing circuit configured to generate the ET target voltage based on a second set of parameters. The dual-input ETIC further includes a control circuit configured to determine the first set of parameters and the second set parameters based at least on the ET power range of the power amplifier circuit(s). By determining the first set of parameters and the second set of parameters based on the ET power range, it may be possible to optimize the dual-input ETIC performance in a wide-range of modulation bandwidth, thus helping to improve linearity and efficiency of the power amplifier circuit(s).

In one aspect a dual-input ETIC is provided. The dual-input ETIC includes an ET voltage circuit coupled to a power amplifier circuit. The ET voltage circuit is configured to generate an ET voltage based on an ET target voltage and a first set of parameters. The ET voltage circuit is also configured to provide the ET voltage to the power amplifier circuit for amplifying an RF signal in an ET power range. The dual-input ETIC also includes a target voltage processing circuit configured to generate the ET target voltage based on a second set of parameters. The dual-input ETIC also includes a control circuit. The control circuit is configured to receive a power range input signal indicative of the ET power range. The control circuit is also configured to determine the first set of parameters and the second set of parameters based on the ET power range indicated by the power range input signal. The control circuit is also configured to configure the ET voltage circuit to generate the ET voltage based on the first set of parameters. The control circuit is also configured to configure the target voltage processing circuit to generate the ET target voltage based on the second set of parameters.

In another aspect, an ET amplifier apparatus is provided. The ET amplifier apparatus includes a power amplifier circuit configured to amplify an RF signal in an ET power range based on an ET voltage. The ET amplifier apparatus also includes a dual-input ETIC. The dual-input ETIC includes an ET voltage circuit coupled to the power amplifier circuit. The ET voltage circuit is configured to generate the ET voltage based on an ET target voltage and a first set of parameters. The ET voltage circuit is also configured to provide the ET voltage to the power amplifier circuit for amplifying the RF signal to the ET power range. The dual-input ETIC also includes a target voltage processing circuit configured to generate the ET target voltage based on a second set of parameters. The dual-input ETIC also includes a control circuit. The control circuit is configured to receive a power range input signal indicative of the ET power range. The control circuit is also configured to determine the first set of parameters and the second set of parameters based on the ET power range indicated by the power range input signal. The control circuit is also configured to configure the ET voltage circuit to generate the ET voltage based on the first set of parameters. The control circuit is also configured to configure the target voltage processing circuit to generate the ET target voltage based on the second set of parameters.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1B:
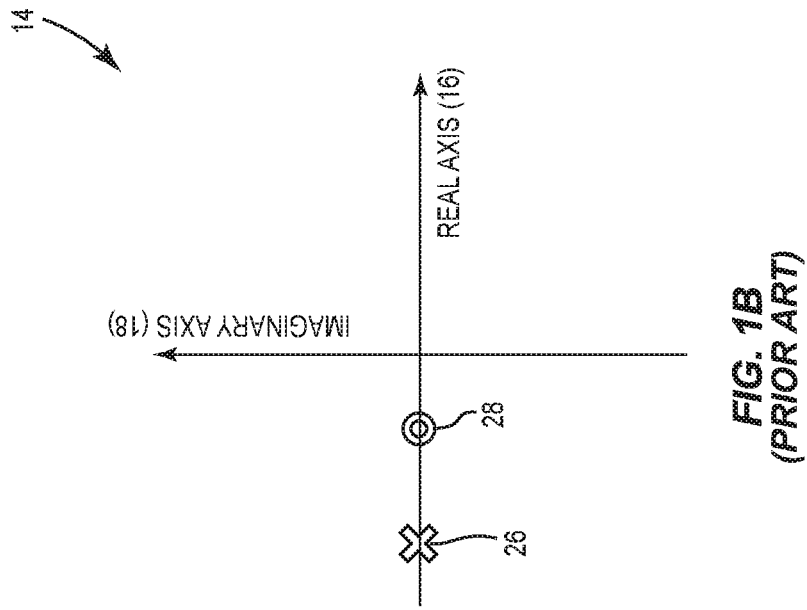
FIG. 1B is a graphic diagram providing an exemplary illustration of a real-pole and a real-zero as graphed in the s-plane of FIG. 1A.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a dual-input envelope tracking (ET) integrated circuit (ETIC) and related apparatus. In examples discussed herein, the dual-input ETIC includes an ET voltage circuit configured to generate an ET voltage based on an ET voltage and a first set of parameters. The ET voltage may be provided to a power amplifier circuit(s) for amplifying a radio frequency (RF) signal(s) in an ET power range. The dual-input ETIC also includes a target voltage processing circuit configured to generate the ET target voltage based on a second set of parameters. The dual-input ETIC further includes a control circuit configured to determine the first set of parameters and the second set parameters based at least on the ET power range of the power amplifier circuit(s). By determining the first set of parameters and the second set of parameters based on the ET power range, it may be possible to optimize the dual-input ETIC performance in a wide-range of modulation bandwidth, thus helping to improve linearity and efficiency of the power amplifier circuit(s).

Figure 1A:
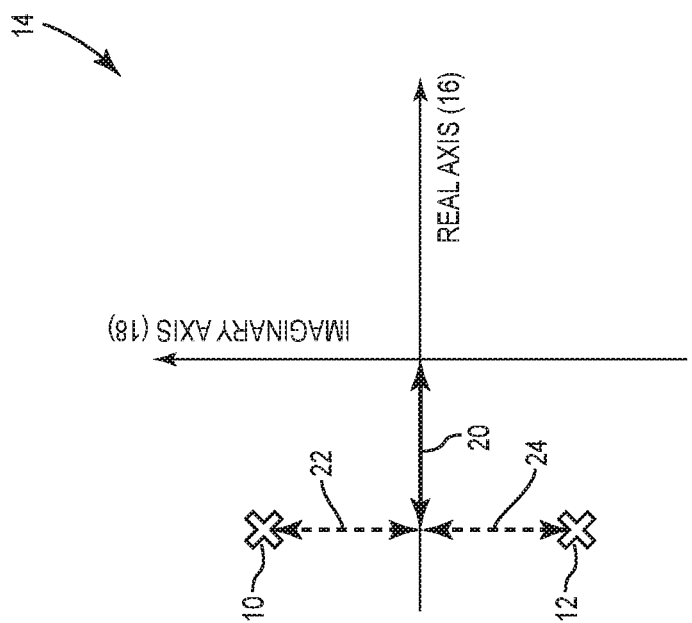
FIG. 1A is a graphic diagram providing an exemplary illustration of a pair of complex conjugate poles graphed in an s-plane.

Before discussing the dual-input ETIC of the present disclosure, a brief overview of transfer function is first provided with reference to FIGS. 1A and 1B to help define a high-order transfer function (e.g., second-order complex-pole transfer function) and a first-order real-pole/real-zero transfer function. An overview of an existing ET amplifier apparatus is then provided with reference FIG. 2. The discussion of specific exemplary aspects of a dual-input ETIC of the present disclosure, which can achieve improved performance over the existing ET amplifier apparatus, starts below with reference to FIG. 3.

A transfer function of a system, which is commonly denoted as $H(s)$, can be expressed in the equation (Eq. 1) below.

$$H(s) = \frac{N(s)}{D(s)} \qquad \text{(Eq. 1)}$$

In the equation (Eq. 1) above, N(s) and D(s) are simple polynomials that define a zero(s) and a pole(s) of the transfer function H(s), respectively. More specifically, the zero(s) is the root(s) of the polynomial N(s) and can be determined by solving the equation N(s)=0. In this regard, the order of the polynomial N(s) determines the number of zero(s) of the transfer function H(s). The zero(s) corresponds to a zero output(s) of the transfer function H(s). The polynomial N(s) is a zero-order polynomial when the polynomial N(s) represents a constant value and a first-order polynomial when the polynomial N(s) is equal to $1+b_0 s$.

In contrast, the pole(s) is the root(s) of the polynomial D(s) and can be determined by solving the equation D(s)=0. In this regard, the order of the polynomial D(s) determines the number of poles of the transfer function H(s). The pole(s) corresponds to an infinite output(s) of the transfer function H(s). The polynomial D(s) is a zero-order polynomial when the polynomial D(s) represents a constant value and a first-order polynomial when the polynomial is equal to $1+a_0 s$. The polynomial D(s) becomes a second-order polynomial when the polynomial D(s) is equal to $1+a_0 s + a_1 s^2$, a third-order polynomial when the polynomial D(s) is equal to $1+a_0 s + a_1 s^2 + a_2 s^3$, and so on. In this regard, the polynomial D(s) is a high-order polynomial when the polynomial D(s) is not a zero-order or a first-order polynomial. Accordingly, the transfer function H(s) becomes a high-order transfer function H(s) when the polynomial D(s) is the high-order polynomial. More specifically, the transfer function H(s) is hereinafter referred to as a second-order complex-pole transfer function when the polynomial D(s) is the second-order polynomial and a complex-pole/real-pole transfer function when the polynomial D(s) is the third-order polynomial.

In one example, N(s) can be a zero-order polynomial and D(s) can be a second-order polynomial. Accordingly, the transfer function H(s) becomes a second-order transfer function having two poles. When the two poles are complex conjugate poles (e.g., damping factor<1), the transfer function H(s) is hereinafter referred to as a second-order complex-pole transfer function. In contrast, when the two poles are real poles (e.g., damping factor>1), the transfer function H(s) is hereinafter referred to as a second-order real-pole transfer function.

FIG. 1A is a graphic diagram providing an exemplary illustration of a pair of complex conjugate poles 10, 12 graphed in an s-plane 14. The s-plane 14 is a complex plane for graphing Pierre-Simon Laplace (Laplace) transforms. The s-plane 14 includes a real axis 16 and an imaginary axis 18 perpendicular to the real axis 16. The complex conjugate poles 10, 12, as graphed in the s-plane 14, have real parts 20 that are equal in magnitude and sign. The complex conjugate poles 10, 12 have imaginary parts 22, 24, respectively. The imaginary parts 22, 24 are equal in magnitude, but opposing in sign.

In another example, N(s) and D(s) are both first order polynomials. Accordingly, the transfer function H(s) becomes a first-order transfer function with one pole and one zero. FIG. 1B is a graphic diagram providing an exemplary illustration of a real-pole 26 and a real-zero 28 as graphed in the s-plane 14 of FIG. 1A.

The real-pole 26 and the real-zero 28 are both located on the real axis 16. Although the real-pole 26 as shown is farther apart from the imaginary axis 18 than the real-zero 28, it is also possible for the real-pole 26 to be closer to the imaginary axis 18 than the real-zero 28. With the real-pole 26 and the real-zero 28 both located on the real axis 16, the transfer function H(s) is hereinafter referred to as a first-order real-pole/real-zero transfer function.

In another example, N(s) can be a first-order polynomial with real-pole/real-zero and D(s) can be a third-order polynomial with two complex poles and a real-pole. In this regard, the transfer function H(s) can be referred to as a "second-order complex-pole in series with first-order real-pole/real-zero" transfer function.

Figure 2:
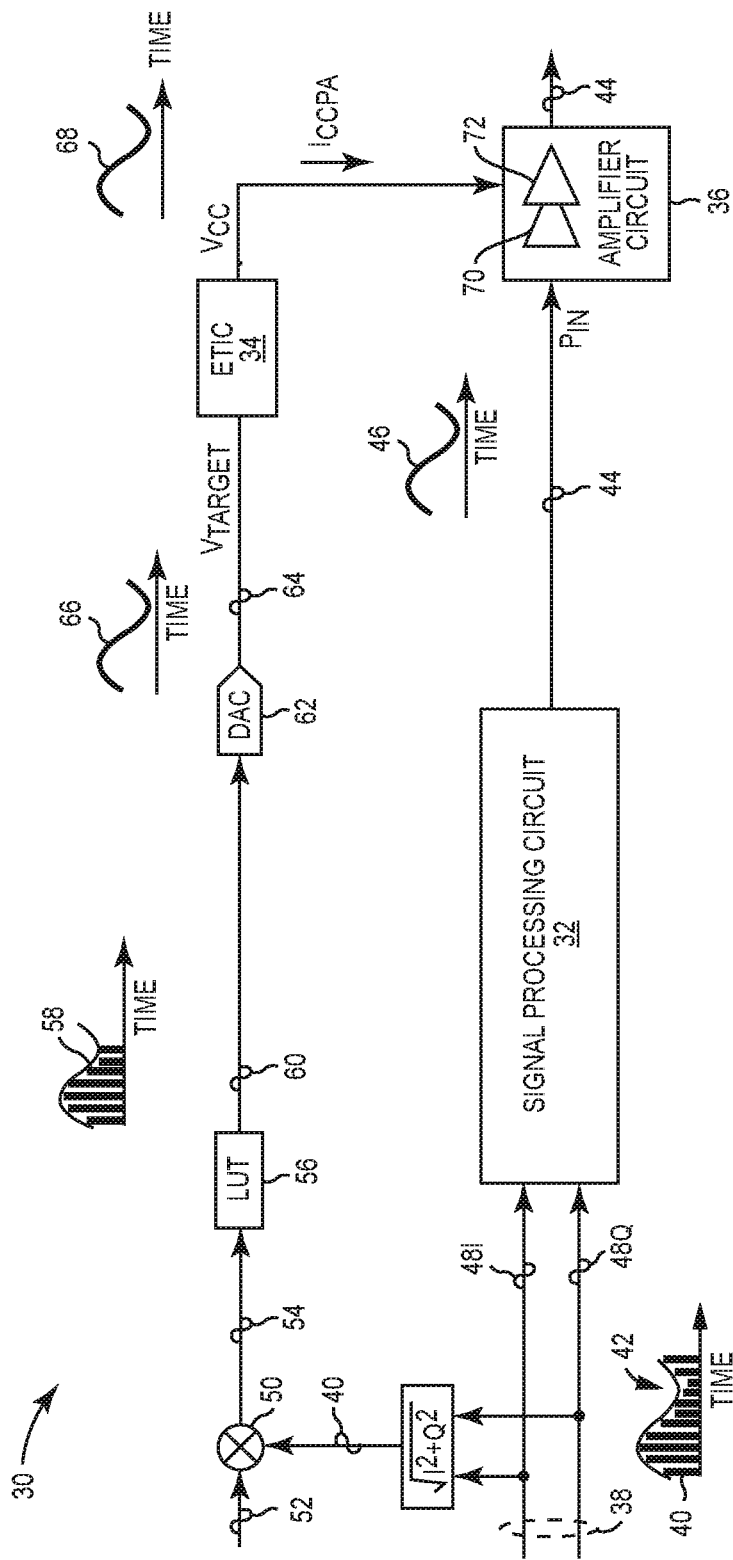
FIG. 2 is a schematic diagram of an exemplary existing envelope tracking (ET) amplifier apparatus that can experience degraded overall linearity performance as a result of inherent processing and/or propagation delays of the existing ET apparatus.

FIG. 2 is a schematic diagram of an exemplary existing ET amplifier apparatus 30 that can experience a degraded overall linearity performance as a result of inherent processing and/or propagation delays of the existing ET amplifier apparatus 30. The existing ET amplifier apparatus 30 includes a signal processing circuit 32, an ETIC 34, and a power amplifier circuit 36 (denoted as "amplifier circuit"). The signal processing circuit 32 receives a digital signal 38 that includes a number of time-variant digital signal amplitudes 40 representing a time-variant digital signal envelope 42. The phrase "time-variant" is used hereinafter to refer to a parameter (e.g., amplitude, voltage, power, etc.) that changes (e.g., increases or decreases) over time.

The signal processing circuit 32 is configured to convert the digital signal 38 into an RF signal 44 having a time-variant signal envelope 46 formed based on the time-variant digital signal envelope 42. In this regard, the time-variant digital signal envelope 42, which is defined by the time-variant digital signal amplitudes 40, can be seen as a digital representation of the time-variant signal envelope 46. Therefore, the time-variant signal envelope 46 represents a time-variant input power $P_{IN}$ of the RF signal 44, which is related to the time-variant digital signal amplitudes 40.

The digital signal 38 may be modulated to include a digital in-phase signal 48I, which has a number of time-variant in-phase amplitudes I, and a digital quadrature signal 48Q, which has a number of time-variant quadrature amplitudes Q. In this regard, each of the time-variant digital signal amplitudes 40 of the digital signal 38 can be expressed as $\sqrt{I^2 + Q^2}$.

The existing ET amplifier apparatus 30 includes a mixer 50 that combines the time-variant digital signal amplitudes 40 with a digital voltage reference signal 52 to generate a digital target voltage reference signal 54. In this regard, the digital target voltage reference signal 54 is associated with the time-variant digital signal envelope 42 and, therefore, the time-variant digital signal amplitudes 40.

The existing ET amplifier apparatus 30 includes lookup table (LUT) circuitry 56, which may store a number of predetermined target voltage amplitude values corresponding to the time-variant digital signal amplitudes 40. In this regard, the LUT circuitry 56 converts the time-variant digital signal amplitudes 40 into a number of time-variant digital target voltage amplitudes 58 to generate a digital target voltage signal 60. As a result of such digital conversion, the time-variant digital target voltage amplitudes 58 may be distorted. For example, the LUT circuitry 56 can be non-strictly monotonic. As a result, a digital target voltage amplitude among the time-variant digital target voltage amplitudes 58 can become higher or lower than a corresponding digital signal amplitude among the time-variant digital signal amplitudes 40.

The existing ET amplifier apparatus 30 includes a voltage digital-to-analog converter (DAC) 62 configured to convert the digital target voltage signal 60 into a target voltage signal 64 having a time-variant target voltage envelope 66 formed based on the time-variant digital target voltage amplitudes 58. The voltage DAC 62 is configured to provide the target voltage signal 64 to the ETIC 34.

The ETIC 34 receives the target voltage signal 64 having the time-variant target voltage envelope 66. The time-variant target voltage envelope 66 may represent an ET target voltage $V_{TARGET}$ for the ETIC 34. Given that the ET target voltage $V_{TARGET}$ is generated based on the digital target voltage signal 60, which is further related to the time-variant digital signal amplitudes 40, the ET target voltage $V_{TARGET}$ may also be related to the time-variant digital signal amplitudes 40. The ETIC 34 is configured to generate an ET voltage $V_{CC}$ having a time-variant ET voltage envelope 68 that tracks the time-variant target voltage envelope 66. The ET voltage $V_{CC}$ is a time-variant ET voltage formed based on the ET target voltage $V_{TARGET}$. Accordingly, the ET voltage $V_{CC}$ tracks the ET target voltage $V_{TARGET}$.

The power amplifier circuit 36 is coupled to the signal processing circuit 32 to receive the RF signal 44 having the time-variant signal envelope 46. The power amplifier circuit 36 is also coupled to the ETIC 34 to receive the ET voltage $V_{CC}$ corresponding to the time-variant ET voltage envelope 68. The power amplifier circuit 36 is configured to amplify the RF signal 44 based on the ET voltage $V_{CC}$.

The power amplifier circuit 36 may appear to the ETIC 34 as a current source and induce a load current $I_{CCPA}$ in response to receiving the ET voltage $V_{CC}$. In case the time-variant signal envelope 46 corresponds to a higher peak-to-average ratio (PAR), the ETIC 34 may have to source at least a portion of the load current $I_{CCPA}$ to keep track of the time-variant signal envelope 46. In this regard, to avoid amplitude clipping in the RF signal 44, the load current $I_{CCPA}$ needs to rise and fall from time to time in accordance to the time-variant signal envelope 46 of the RF signal 44. Further, to maintain linearity and efficiency in the power amplifier circuit 36, the time-variant ET voltage envelope 68 of the ET voltage $V_{CC}$ also needs to align closely with the time-variant signal envelope 46 at the power amplifier circuit 36.

However, the signal processing circuit 32, the LUT circuitry 56, the voltage DAC 62, and the ETIC 34 may each incur processing and/or propagation delays. In addition, the power amplifier circuit 36 may be a multi-stage amplifier including a driver stage 70 and an output stage 72 that also incur respective processing and/or propagation delays. As a result, the time-variant ET voltage envelope 68 may be out of alignment with the time-variant signal envelope 46 at the power amplifier circuit 36. Consequently, the power amplifier circuit 36 may suffer degraded linearity and efficiency. Hence, it may be desired to optimize the existing ET amplifier apparatus 30 to help improve linearity and efficiency of the power amplifier circuit 36.

Figure 3:
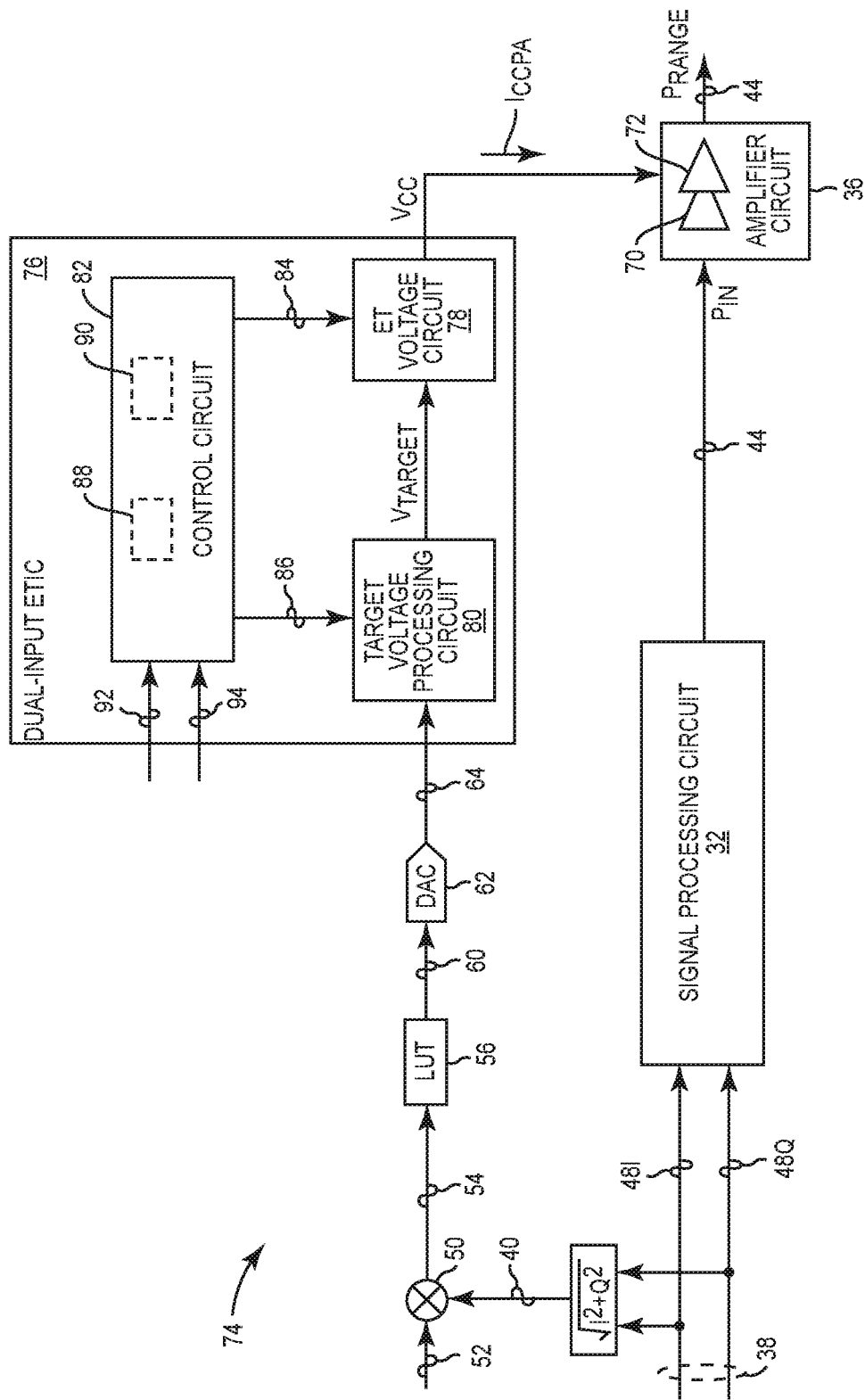
FIG. 3 is a schematic diagram of an exemplary ET amplifier apparatus configured according to an embodiment of the present disclosure to provide optimized performance over the existing ET amplifier apparatus of FIG. 2.

In this regard, FIG. 3 is a schematic diagram of an exemplary ET amplifier apparatus 74 configured according to an embodiment of the present disclosure to provide optimized performance over the existing ET amplifier apparatus 30 of FIG. 2. In a non-limiting example, the ET amplifier apparatus 74 is configured by replacing the ETIC 34 in the existing ET amplifier apparatus 30 with a dual-input ETIC 76 having enhanced functionalities compared to the ETIC 34. As such, it may be possible to improve performance of the existing ET amplifier apparatus 30 with minimal change (e.g., layout) in the existing ET amplifier apparatus 30. In this regard, the ET amplifier apparatus 74 may include a number of common elements as provided in the existing ET amplifier apparatus 30. These common elements are shown herein with common element numbers and will not be re-described for the sake of clarity and conciseness.

The dual-input ETIC 76 can include an ET voltage circuit 78, a target voltage processing circuit 80, and a control circuit 82. The ET voltage circuit 78 is configured to generate an ET voltage $V_{CC}$ based on an ET target voltage $V_{TARGET}$ and a first set of parameters 84. The ET voltage circuit 78 may be coupled to the power amplifier circuit 36, which is configured to amplify the RF signal 44 in an ET power range $P_{RANGE}$ based on the ET voltage $V_{CC}$. In a non-limiting example, the ET power range $P_{RANGE}$ is bounded by a minimum root-mean-square (RMS) power and a maximum RMS power of the RF signal 44 at the output stage 72 of the power amplifier circuit 36. The target voltage processing circuit 80 is configured to generate the ET target voltage $V_{TARGET}$ based on a second set of parameters 86. The control circuit 82, which may include a controller 88 (e.g., a microcontroller, a microprocessor, etc.) and a register bank 90 (e.g., non-volatile memory), is configured to determine the first set of parameters 84 and/or the second set of parameters 86 for the ET voltage circuit 78 and/or the target voltage processing circuit 80.

In examples discussed herein, the control circuit 82 is configured to receive a power range input signal 92 as a first of the dual-input and a modulation bandwidth input signal 94 as a second of the dual-input. The power range input signal 92 is configured to provide an indication of the define power range $P_{RANGE}$ and the modulation bandwidth input signal 94 is configured to provide an indication of a modulation bandwidth of the RF signal 44. In a non-limiting example, the power range input signal 92 and the modulation bandwidth input signal 94 can be provided by a transceiver circuit (not shown), which may also generate the digital signal 38 that corresponds to the RF signal 44.

In this regard, the control circuit 82 can be configured to determine the first set of parameters 84 and the second set of parameters 86 based on the ET power range $P_{RANGE}$, as indicated by the power range input signal 92, and/or the modulation bandwidth of the RF signal 44, as indicated by the modulation bandwidth input signal 94. By determining the first set of parameters 84 and the second set of parameters 86 based on the power range input signal 92 and the modulation bandwidth input signal 94, it may be possible to optimize respective settings of the ET voltage circuit 78 and the target voltage processing circuit 80, thus helping to optimize linearity and efficiency of the power amplifier circuit 36.

Figure 4:
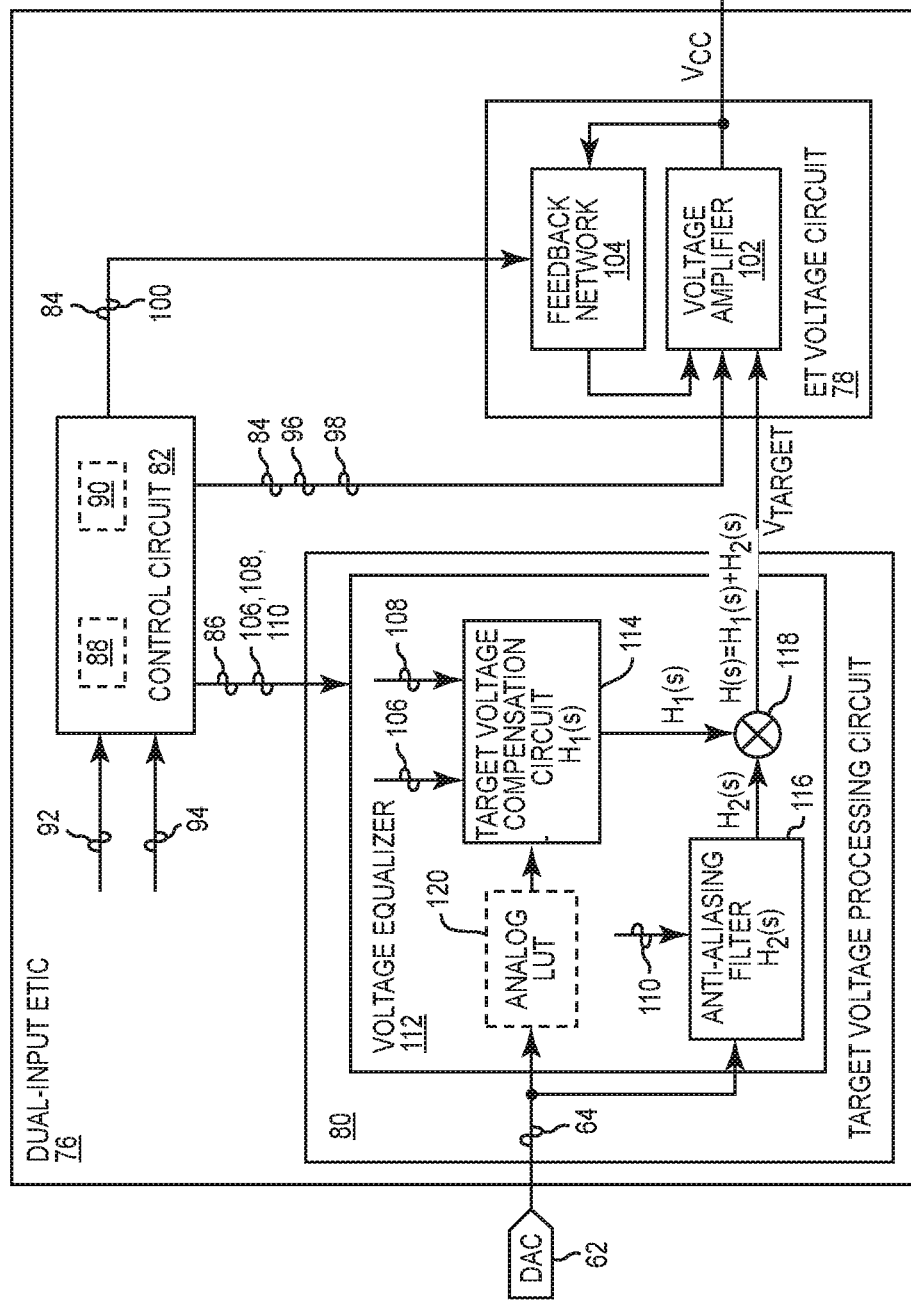
FIG. 4 is a schematic diagram of an exemplary dual-input ET integrated circuit (ETIC), which can be provided in the ET amplifier apparatus of FIG. 3 to enable the optimized performance over the existing ET amplifier apparatus of FIG. 2.

FIG. 4 is a schematic diagram providing an exemplary illustration of the dual-input ETIC 76 configured according to an embodiment of the present disclosure. Common elements between FIGS. 3 and 4 are shown therein with common element numbers and will not be re-described herein.

In a non-limiting example, the first set of parameters 84 and the second set of parameters 86 can be predetermined based on predefined granularities of the modulation bandwidth and the ET power range. In this regard, the control circuit 82 can be configured to store the first set of parameters 84 and the second set of parameters 86 in the form of a parameter look-up table (LUT) in the register bank 90. An example of the parameter LUT is shown below.

| Parameter Look-up Table (LUT) | | |
|---|---|---|
| Modulation Bandwidth | ET Power Range | First Set of Second Set of Parameters Parameters |
| <100 resource blocks (RBs) | — | |
| ≥100 RBs and <200 RBs | power range 1 | |
| | power range 2 | |
| | power range 3 | |
| | power range 4 | |
| ≥200 RBs | power range 1 | |
| | power range 2 | |
| | power range 3 | |
| | power range 4 | |

In one embodiment, the control circuit 82 may be configured to determine the first set of parameters 84 and the second set of parameters 86 based on both the power range input signal 92 and the modulation bandwidth input signal 94 when the modulation bandwidth of the RF signal 44, as indicated by the modulation bandwidth input signal 94, is greater than or equal to a predefined threshold (e.g., ≥100 resource blocks). In contrast, the control circuit 82 may be configured to determine the first set of parameters 84 and the second set of parameters 86 solely based on the modulation bandwidth input signal 94 when the modulation bandwidth of the RF signal 44 is lower than the defined threshold (e.g., <100 resource blocks). In another embodiment, the control circuit 82 may also be configured to determine the first set of parameters 84 and the second set of parameters 86 based on both the power range input signal 92 and the modulation bandwidth input signal 94 independent of the modulation bandwidth of the RF signal 44. It should be appreciated that the parameter LUT can be configured based on different structures and/or include different levels of granularities with respect to the modulation bandwidth and the ET power range without affecting operating principles of the dual-input ETIC 76.

The first set of parameters 84 may include a first parameter 96, a second parameter 98, and a third parameter 100. In a non-limiting example, the first parameter 96 can be configured to adjust a slew rate of the ET voltage circuit 78, the second parameter 98 can be configured to adjust a modulation bandwidth of the ET voltage circuit 78, and the third parameter 100 can be configured to adjust an output impedance $Z_{ETIC}$ of the ET voltage circuit 78.

In a non-limiting example, the ET voltage circuit 78 includes at least one voltage amplifier 102 and at least one feedback network 104. The voltage amplifier 102 may be configured to adjust the slew rate and the modulation bandwidth based on the first parameter 96 and the second parameter 98, respectively. The voltage amplifier 102 is further configured to generate the ET voltage $V_{CC}$ that changes (e.g., rises and falls) in accordance to the ET target voltage $V_{TARGET}$. The voltage amplifier 102 may be further configured to provide the ET voltage $V_{CC}$ to the power amplifier circuit 36 for amplifying the RF signal 44 in the ET power range. The feedback network 104 is configured to provide a feedback of the ET voltage $V_{CC}$, which may be identical or proportional to the ET voltage $V_{CC}$, to the voltage amplifier 102. The feedback network 104 may be configured to receive the third parameter 100 and adjust the output impedance $Z_{ETIC}$ based on the third parameter 100.

The second set of parameters 86 may include a fourth parameter 106, a fifth parameter 108, and a sixth parameter 110 configured to cause the target voltage processing circuit 80 to generate the ET target voltage $V_{TARGET}$ based on a defined transfer function H(s). More specifically, the target voltage processing circuit 80 may include a voltage equalizer 112 configured to generate the ET target voltage $V_{TARGET}$ by performing the defined transfer function H(s).

The voltage equalizer 112 may include a voltage compensation circuit 114 and an anti-aliasing filter 116. The voltage compensation circuit 114 may be configured to perform a first transfer function $H_1(s)$ based on the fourth parameter 106 or the fifth parameter 108. The voltage compensation circuit 114 may be configured to perform the first transfer function $H_1(s)$ as a first-order real-pole/real-zero transfer function in response to receiving the fourth parameter 106. Alternatively, the voltage compensation circuit 114 may be configured to perform the first transfer function $H_1(s)$ as a second-order complex-pole transfer function in response to receiving the fifth parameter 108. The anti-aliasing filter 116 may be configured to perform a second transfer function $H_2(s)$ to filter out aliasing components generated by the voltage DAC 62 in response to receiving the sixth parameter 110. The voltage equalizer 112 may include a summing circuit 118 configured to sum the first transfer function $H_1(s)$ and the second transfer function $H_2(s)$ into the defined transfer function H(s). In this regard, the first transfer function $H_1(s)$ and the second transfer function $H_2(s)$ collectively determine the defined transfer function H(s) of the voltage equalizer 112 (H(s)=$H_1(s)$+$H_2(s)$).

The power amplifier circuit 36 is coupled to the dual-input ETIC 76 to receive the ET voltage $V_{CC}$. The power amplifier circuit 36 sees a source impedance $Z_{SOURCE}$, which represents a combination of the output impedance $Z_{ETIC}$, a trace inductance $L_{TRACE}$, and a capacitance $C_{FLY}$, among other impedance sources. Notably, the power amplifier circuit 36 has load-line impedance $R_{ICC}$, which can induce a load current $I_{CCPA}$ ($V_{CC}=I_{CCPA}*R_{ICC}$) based on the ET voltage $V_{CC}$. In this regard, the power amplifier circuit 36 behaves as a current source to the dual-input ETIC 76 and the ET voltage $V_{CC}$ becomes a function of the load-line impedance $R_{ICC}$ and the load current $I_{CCPA}$. In other words, the load current $I_{CCPA}$ and/or the load-line impedance $R_{ICC}$ may be manipulated to affect the ET voltage $V_{CC}$.

Notably, the load current $I_{CCPA}$ can be a function of the time-variant input power $P_{IN}$ of the RF signal 44 (e.g., $I_{CCPA}=f_1(P_{IN})$). As previously discussed in FIG. 2, the time-variant input power $P_{IN}$ and the ET target voltage $V_{TARGET}$ are both related to the time-variant digital signal amplitudes 40. As such, the ET target voltage $V_{TARGET}$ may also be a function of the time-variant input power $P_{IN}$ of the RF signal 44 (e.g., $V_{TARGET}=f_2(P_{IN})$). In this regard, the load current $I_{CCPA}$ can be expressed as $I_{CCPA}=f_1(f_2^{-1}(V_{TARGET}))$, wherein $f_2^{-1}(V_{TARGET})$ is an inverse of the function $V_{TARGET}=f_2(P_{IN})$. Accordingly, the load current $I_{CCPA}$ can be further expressed as a function of the ET target voltage $V_{TARGET}$ (e.g., $I_{CCPA}=f(V_{TARGET})$). As such, it may be possible to configure the voltage compensation circuit 114 to introduce a compensation term $f(V_{TARGET})*Z_{SOURCE}$ in the first transfer function $H_1(s)$. Thus, by combining the first transfer function $H_1(s)$ and the second transfer function $H_2(s)$ to form the defined transfer function H(s), the voltage equalizer 112 may be able to compensate for fluctuation in the ET voltage $V_{CC}$ caused by changes in the load current $I_{CCPA}$ as a result of variations in the source impedance $Z_{SOURCE}$. The voltage equalizer 112 may further include an analog LUT 120 configured to correlate the ET target voltage $V_{TARGET}$ with the load current $I_{CCPA}$.

The function $I_{CCPA}=f(V_{TARGET})$ may be further expressed as equation (Eq. 2) below.

$$I_{CCPA}=(V_{TARGET}-V0)/R_{ICC} \qquad (Eq.\ 2)$$

In the equation (Eq. 2) above, V0 represents the ET voltage $V_{CC}$ corresponding to a zero load current ($I_{CCPA}$=0) for a given $V_{CC}$-$I_{CCPA}$ slope. Accordingly, the voltage compensation circuit 114 may be further configured to introduce the compensation term as ($V_{TARGET}$/$R_{ICC}$)*$Z_{SOURCE}$ in the first transfer function $H_1$(s). As such, it may be possible to eliminate the analog LUT 120 from the voltage equalizer 112.

As previously mentioned, the dual-input ETIC 76 is configured to generate the ET voltage $V_{CC}$ in accordance to the ET target voltage $V_{TARGET}$. As such, the ET voltage $V_{CC}$ can be approximated in equation (Eq. 3) based on the equation (Eq. 2).

$$V_{CC} \approx V_{TARGET} = I_{CCPA} * R_{ICC} + V0 \qquad (Eq. 3)$$

Figure 5:
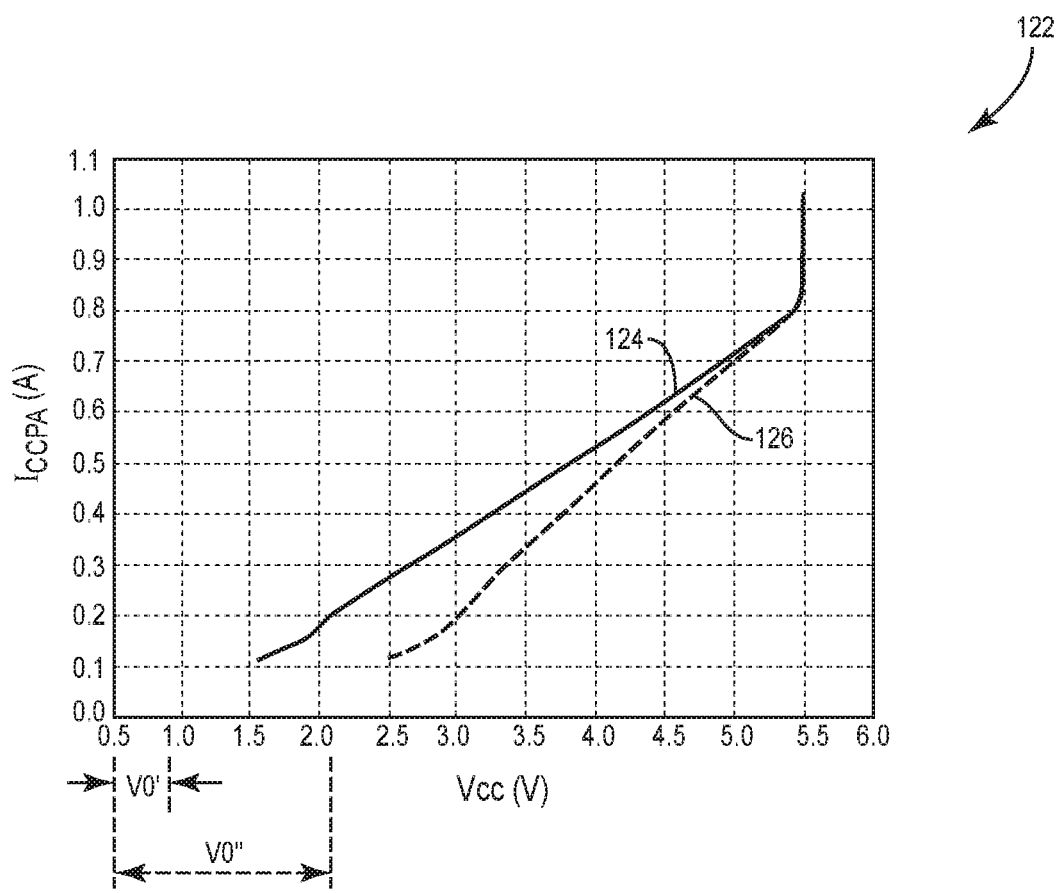
FIG. 5 is a graphic diagram providing an exemplary illustration of a load line equation(s) of a power amplifier circuit in the ET amplifier apparatus of FIG. 3.

FIG. 5 is a graphic diagram 122 providing an exemplary illustration of a load line equation(s) of the power amplifier circuit 36 in FIG. 4. Elements in FIGS. 3 and 4 are referenced in conjunction with FIG. 5 and will not be re-described herein.

The graphic diagram 122 includes a first load line 124 and a second load line 126. The first load line 124 corresponds to the load-line impedance $R_{ICC}$ of approximately 5.71Ω and therefore a first $V_{CC}$-$I_{CCPA}$ slope of 1/5.71Ω. The second load line 126 corresponds to the load-line impedance $R_{ICC}$ of approximately 4.16Ω and therefore a second $V_{CC}$-$I_{CCPA}$ slope of 1/4.16Ω. In this regard, the first load line 124 may correspond to an isogain ET LUT and the second load line 126 may correspond to a low-slope ET LUT.

Notably, when the time-variant input power $P_{IN}$ decreases, a peak-to-peak of the ET voltage $V_{CC}$ reduces accordingly. As such, the dynamic range and slew rate of the voltage amplifier 102 may reduce as well. In this regard, it may be possible to use the second parameter 98 to reduce the modulation bandwidth of the voltage amplifier 102 and thus to reduce the load current $I_{CCPA}$ in the power amplifier circuit 36. As a result, it may be possible to maintain the ET voltage $V_{CC}$ even when the time-variant input power PIN is reduced, thus helping to improve efficiency of the power amplifier circuit 36. In addition, as shown in FIG. 6 below, it may also be possible to use the first parameter 96 to reduce the slew rate of the voltage amplifier 102 to help improve stability of the power amplifier circuit 36 when the time-variant input power $P_{IN}$ becomes lower.

Figure 6:
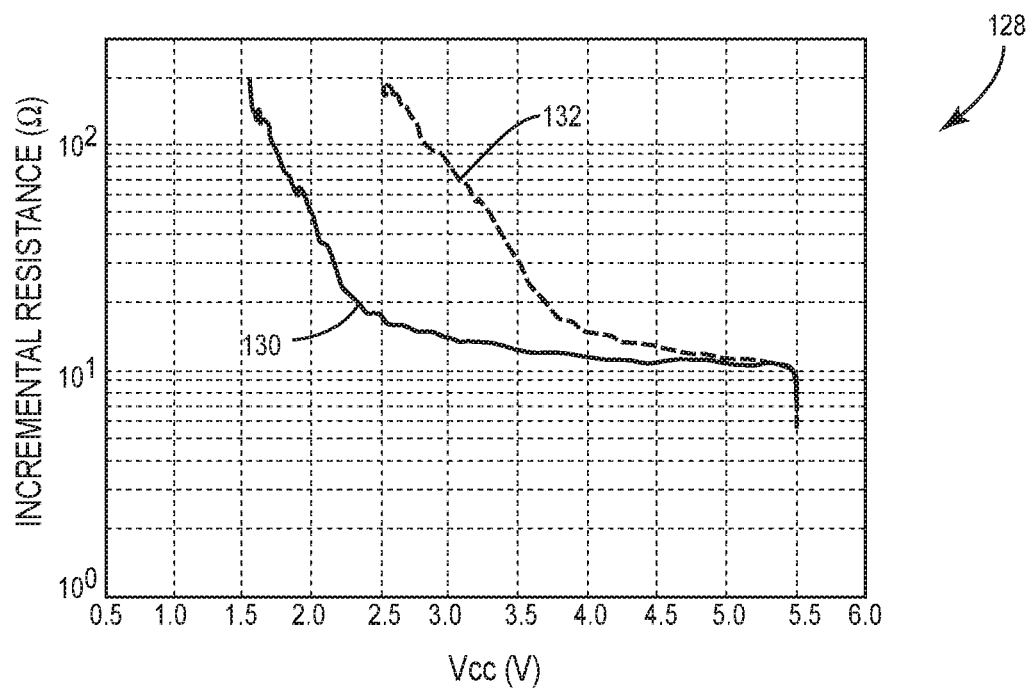
FIG. 6 is a graphic diagram providing an exemplary illustration of incremental resistances corresponding to a pair of load lines in the graphic diagram of FIG. 5.

In this regard, FIG. 6 is a graphic diagram 128 providing an exemplary illustration of incremental resistances corresponding to the first load line 124 and the second load line 126 in the graphic diagram 122 of FIG. 5. The graphic diagram 128 includes a first incremental resistance line 130 corresponding to the first load line 124 and a second incremental resistance line 132 corresponding to the second load line 126. Notably, the incremental resistance, which can be defined as $dI_{CCPA}/dN_{CC}$, corresponding to the second load line 126 is significantly higher than the incremental resistance corresponding to the first load line 124. As such, it may be necessary to adjust the first set of parameters 84 and the second set of parameters 86 in accordance to load line slope (e.g., slew rate) of the voltage amplifier 102.

With reference back to FIG. 3, in addition to adjusting the first set of parameters 84 and the second set of parameters 86, the ET power range $P_{RANGE}$ indicated by the power range input signal 92 can be further utilized to optimize settings for other circuits in the ET amplifier apparatus 74. For example, the dual-input ETIC 76 may include a multi-level charge pump (not shown) and/or an inductance-based buck-boost circuit (not shown) that typically includes a number of different transistors (e.g., different sizes). In this regard, it may be possible to selectively activate the different transistors based on the ET power range $P_{RANGE}$ to help improve efficiency of the multi-level charge pump and/or the inductance-based buck-boost circuit.

Those skilled in the art will recognize improvements and modifications to the embodiments of the present disclosure. All such improvements and modifications are considered within the scope of the concepts disclosed herein and the claims that follow.

What is claimed is:

1. A dual-input envelope tracking (ET) integrated circuit (ETIC) comprising:
    an ET voltage circuit coupled to a power amplifier circuit and configured to:
        generate an ET voltage based on an ET target voltage and a first set of parameters; and
        provide the ET voltage to the power amplifier circuit for amplifying a radio frequency (RF) signal in an ET power range;
    a target voltage processing circuit configured to generate the ET target voltage based on a second set of parameters; and
    a control circuit configured to:
        receive a power range input signal indicative of the ET power range;
        determine the first set of parameters and the second set of parameters based on the ET power range indicated by the power range input signal;
        configure the ET voltage circuit to generate the ET voltage based on the first set of parameters; and
        configure the target voltage processing circuit to generate the ET target voltage based on the second set of parameters.

2. The dual-input ETIC of claim 1 wherein the control circuit is further configured to:
    receive a modulation bandwidth input signal indicative of a modulation bandwidth of the RF signal;
    determine the first set of parameters and the second set of parameters based on the ET power range indicated by the power range input signal and the modulation bandwidth indicated by the modulation bandwidth input signal;
    configure the ET voltage circuit to generate the ET voltage based on the first set of parameters; and
    configure the target voltage processing circuit to generate the ET target voltage based on the second set of parameters.

3. The dual-input ETIC of claim 2 wherein the control circuit is further configured to:
    determine the first set of parameters and the second set of parameters based on the ET power range indicated by the power range input signal and the modulation bandwidth indicated by the modulation bandwidth input signal when the modulation bandwidth indicated by the modulation bandwidth input signal is greater than or equal to a predefined threshold; and
    determine the first set of parameters and the second set of parameters based on the modulation bandwidth indicated by the modulation bandwidth input signal when the modulation bandwidth indicated by the modulation bandwidth input signal is lower than the predefined threshold.

4. The dual-input ETIC of claim 2 wherein the control circuit is further configured to determine the first set of parameters and the second set of parameters based on the ET power range indicated by the power range input signal and the modulation bandwidth indicated by the modulation bandwidth input signal independent of the modulation bandwidth indicated by the modulation bandwidth input signal.

5. The dual-input ETIC of claim 2 wherein the control circuit comprises a register bank configured to store the first set of parameters and the second set of parameters based on the modulation bandwidth and the ET power range.

6. The dual-input ETIC of claim 2 wherein the first set of parameters comprises a first parameter configured to adjust slew rate of the ET voltage circuit, a second parameter configured to adjust the modulation bandwidth of the ET voltage circuit, and a third parameter configured to adjust output impedance of the ET voltage circuit.

7. The dual-input ETIC of claim 6 wherein the ET voltage circuit comprises:
  at least one voltage amplifier configured to:
    generate the ET voltage based on the ET target voltage, the first parameter, and the second parameter; and
    provide the ET voltage to the power amplifier circuit for amplifying the RF signal in the ET power range; and
  at least one feedback network configured to adjust the modulation bandwidth of the at least one voltage amplifier based on the third parameter.

8. The dual-input ETIC of claim 6 wherein the second set of parameters comprises a fourth parameter, a fifth parameter, and a sixth parameter configured to cause the target voltage processing circuit to generate the ET target voltage based on a defined transfer function.

9. The dual-input ETIC of claim 8 wherein the target voltage processing circuit comprises a voltage equalizer configured to generate the ET target voltage based on the defined transfer function.

10. The dual-input ETIC of claim 9 wherein the voltage equalizer comprises:
  a voltage compensation circuit configured to:
    perform a first transfer function as a first-order real-pole/real-zero transfer function in response to receiving the fourth parameter; and
    perform the first transfer function as a second-order complex-pole transfer function in response to receiving the fifth parameter; and
  an anti-aliasing filter configured to perform a second transfer function in response to receiving the sixth parameter;
  wherein the first transfer function and the second transfer function collectively determine the defined transfer function of the target voltage processing circuit.

11. An envelope tracking (ET) amplifier apparatus comprising:
  a power amplifier circuit configured to amplify a radio frequency (RF) signal in an ET power range based on an ET voltage; and
  a dual-input ET integrated circuit (ETIC) comprising:
    an ET voltage circuit coupled to the power amplifier circuit and configured to:
      generate the ET voltage based on an ET target voltage and a first set of parameters; and
      provide the ET voltage to the power amplifier circuit for amplifying the RF signal to the ET power range;
    a target voltage processing circuit configured to generate the ET target voltage based on a second set of parameters; and
    a control circuit configured to:
      receive a power range input signal indicative of the ET power range;
      determine the first set of parameters and the second set of parameters based on the ET power range indicated by the power range input signal;
      configure the ET voltage circuit to generate the ET voltage based on the first set of parameters; and
      configure the target voltage processing circuit to generate the ET target voltage based on the second set of parameters.

12. The ET amplifier apparatus of claim 11 wherein the control circuit is further configured to:
  receive a modulation bandwidth input signal indicative of a modulation bandwidth of the RF signal;
  determine the first set of parameters and the second set of parameters based on the ET power range indicated by the power range input signal and the modulation bandwidth indicated by the modulation bandwidth input signal;
  configure the ET voltage circuit to generate the ET voltage based on the first set of parameters; and
  configure the target voltage processing circuit to generate the ET target voltage based on the second set of parameters.

13. The ET amplifier apparatus of claim 12 wherein the control circuit is further configured to:
  determine the first set of parameters and the second set of parameters based on the ET power range indicated by the power range input signal and the modulation bandwidth indicated by the modulation bandwidth input signal when the modulation bandwidth indicated by the modulation bandwidth input signal is greater than or equal to a predefined threshold; and
  determine the first set of parameters and the second set of parameters based on the modulation bandwidth indicated by the modulation bandwidth input signal when the modulation bandwidth indicated by the modulation bandwidth input signal is lower than the predefined threshold.

14. The ET amplifier apparatus of claim 12 wherein the control circuit is further configured to determine the first set of parameters and the second set of parameters based on the ET power range indicated by the power range input signal and the modulation bandwidth indicated by the modulation bandwidth input signal independent of the modulation bandwidth indicated by the modulation bandwidth input signal.

15. The ET amplifier apparatus of claim 12 wherein the control circuit comprises a register bank configured to store the first set of parameters and the second set of parameters based on the modulation bandwidth and the ET power range.

16. The ET amplifier apparatus of claim 12 wherein the first set of parameters comprises a first parameter configured to adjust slew rate of the ET voltage circuit, a second parameter configured to adjust the modulation bandwidth of the ET voltage circuit, and a third parameter configured to adjust output impedance of the ET voltage circuit.

17. The ET amplifier apparatus of claim 16 wherein the ET voltage circuit comprises:
  at least one voltage amplifier configured to:
    generate the ET voltage based on the ET target voltage, the first parameter, and the second parameter; and
    provide the ET voltage to the power amplifier circuit for amplifying the RF signal in the ET power range; and
  at least one feedback network configured to adjust the modulation bandwidth of the at least one voltage amplifier based on the third parameter.

18. The ET amplifier apparatus of claim 16 wherein the second set of parameters comprises a fourth parameter, a fifth parameter, and a sixth parameter configured to cause the target voltage processing circuit to generate the ET target voltage based on a defined transfer function.

19. The ET amplifier apparatus of claim 18 wherein the target voltage processing circuit comprises a voltage equalizer configured to generate the ET target voltage based on the defined transfer function.

20. The ET amplifier apparatus of claim 19 wherein the voltage equalizer comprises:
   a voltage compensation circuit configured to:
      perform a first transfer function as a first-order real-pole/real-zero transfer function in response to receiving the fourth parameter; and
      perform the first transfer function as a second-order complex-pole transfer function in response to receiving the fifth parameter; and
   an anti-aliasing filter configured to perform a second transfer function in response to receiving the sixth parameter;
   wherein the first transfer function and the second transfer function collectively determine the defined transfer function of the target voltage processing circuit.

* * * * *

UNITED STATES PATENT AND TRADEMARK OFFICE
CERTIFICATE OF CORRECTION

PATENT NO.         : 10,998,859 B2
APPLICATION NO.    : 16/435940
DATED              : May 4, 2021
INVENTOR(S)        : Nadim Khlat Page 1 of 1

It is certified that error appears in the above-identified patent and that said Letters Patent is hereby corrected as shown below:

In the Specification

Column 6, Line 36, replace "digital in-phase signal 481" with --digital in-phase signal 48I--.
Column 11, Line 23, replace "approximately 5.710" with --approximately 5.71Ω--.
Column 11, Line 26, replace "approximately 4.160" with --approximately 4.16Ω--.

Signed and Sealed this
Twentieth Day of July, 2021

Drew Hirshfeld
*Performing the Functions and Duties of the*
*Under Secretary of Commerce for Intellectual Property and*
*Director of the United States Patent and Trademark Office*